United States Patent [19]

Bellisio

[11] 4,015,083

[45] Mar. 29, 1977

[54] TIMING RECOVERY CIRCUIT FOR DIGITAL DATA

[75] Inventor: Jules Angelo Bellisio, Wall Township, Monmouth County, N.J.

[73] Assignee: Bell Telephone Laboratories, Incorporated, Murray Hill, N.J.

[22] Filed: Aug. 25, 1975

[21] Appl. No.: 607,331

[52] U.S. Cl. .......................... 178/69.1; 179/15 BS; 325/346; 325/419; 325/420
[51] Int. Cl.² ......................................... H04L 7/00
[58] Field of Search ............... 178/69.5; 179/15 BS; 325/346, 419, 420, 416–418; 328/179, 63, 72

[56] References Cited

UNITED STATES PATENTS

| | | | |
|---|---|---|---|
| 2,858,425 | 10/1958 | Gordon | 328/134 |
| 3,766,484 | 10/1973 | Morris | 179/15 BS X |
| 3,768,030 | 10/1973 | Brown et al. | 331/12 |
| 3,863,156 | 1/1975 | Bogert | 325/346 |
| 3,867,579 | 2/1975 | Colton | 178/69.5 R X |
| 3,878,474 | 4/1975 | Runge | 331/10 |

Primary Examiner—Robert L. Griffin
Assistant Examiner—Michael A. Masinick
Attorney, Agent, or Firm—Richard B. Havill

[57] ABSTRACT

A timing recovery circuit receives a timing component signal and generates a signal having a frequency varying in response to a control signal. In response to a difference between the phase of the variable frequency signal and the phase of the timing component signal, the circuit produces a control component. In response to cycle slips between the variable frequency signal and the timing component signal, the circuit produces a series of pulses having a polarity related to the sense of the cycle slips and having a pulse rate directly related to the rate of the cycle slips except when amplitude of the timing component signals falls below a predetermined value whereupon no pulses are produced. The control component and the series of pulses are combined into the control signal that adjusts the frequency of the generated signal into synchronization with the timing component signal.

16 Claims, 5 Drawing Figures

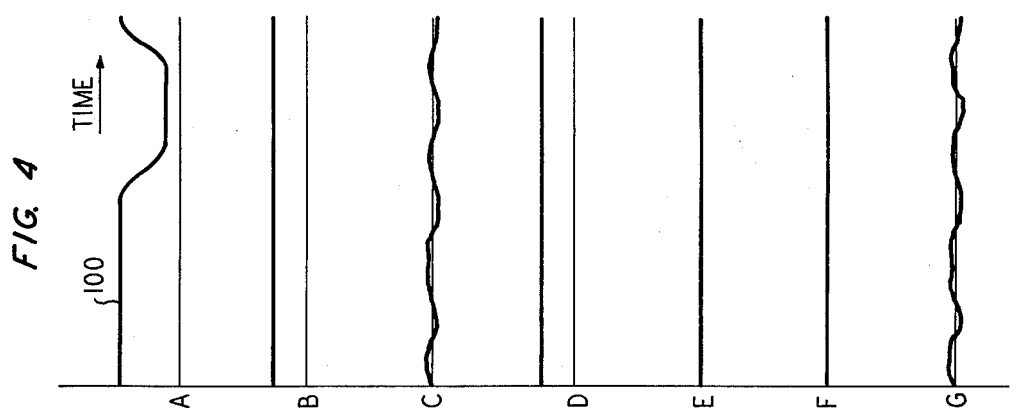
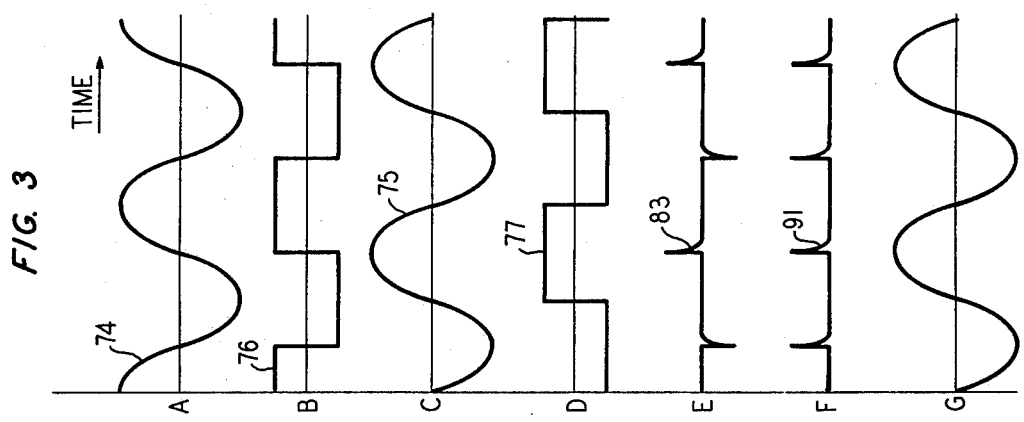
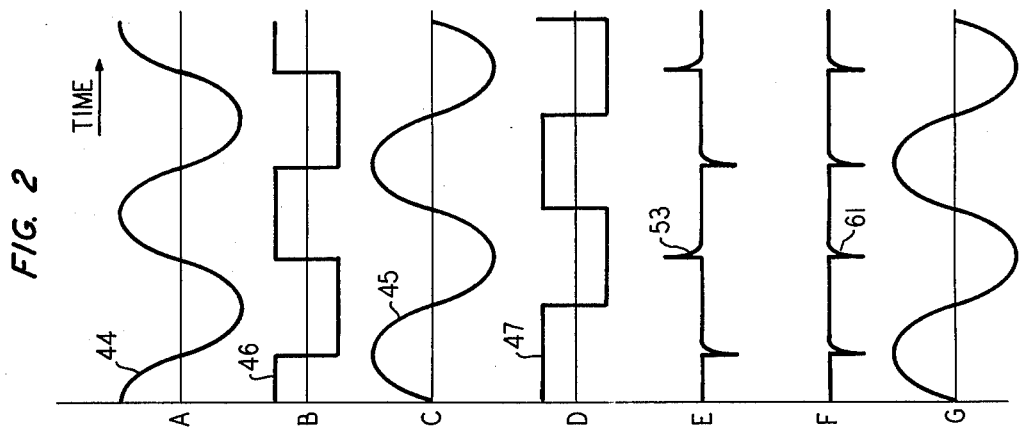

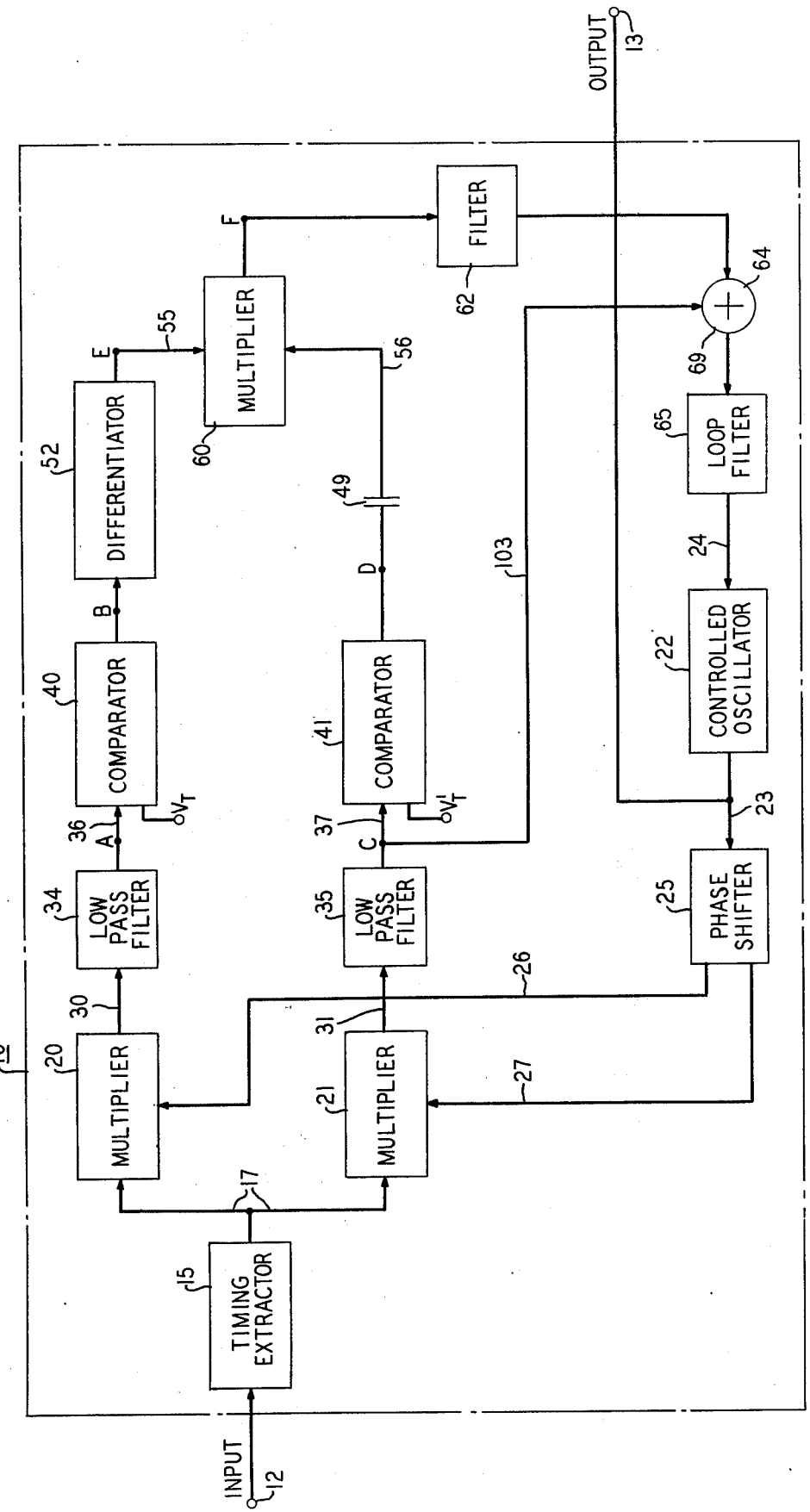

TIMING RECOVERY CIRCUIT FOR DIGITAL DATA

BACKGROUND OF THE INVENTION

The invention is a timing recovery circuit that is more particularly described as a combination of a phase-locked loop and a frequency-locked loop.

Phase-locked loops are commonly used in arrangements to recover timing information in digital transmission systems. A phase-locked loop includes a detector for measuring the difference between the phase of an incoming signal and the phase of an output signal of a controlled oscillator.

Important design objectives for any phase-locked timing recovery arrangement generally include the realization of narrow jitter bandwidth, well controlled jitter transient response and stable phase offset together with rapid wide range acquisition of the input phase and frequency. Timing recovery circuits for random digital data systems must be designed to recover timing from a timing component which varies statistically in both phase and amplitude.

Phase-locked loop arrangements described in the prior art make compromises among the aforementioned important design objectives. In particular, rapid wide range acquisition is often traded off for improvements in the other objectives. Also, improvement of jitter filtering generally is achieved by some trade off which reduces acquisition range and speed.

SUMMARY OF THE INVENTION

It is an object of the invention to recover timing information from baseband digital data.

It is also an object to provide an improved timing recovery arrangement.

It is another object to provide a relatively inexpensive timing recovery arrangement for baseband digital data.

It is a further object to phase-lock an oscillator to a statistically varying input signal.

These and other objects are achieved by a timing recovery circuit arranged for receiving a timing component signal. The circuit generates a signal having a frequency varying in response to a control signal. In response to a difference between the phase of the variable frequency signal and the phase of the timing component signal, the circuit produces a control component. In response to cycle slips between the variable frequency signal and the timing component signal, the circuit produces a series of pulses having a polarity related to the sense of the cycle slips and having a pulse rate directly related to the rate of the cycle slips except when amplitude of the timing component signal falls below a predetermined value whereupon no pulses are produced. The control component and the series of pulses are combined into a control signal that adjusts the frequency of the generated signal to synchronize with the timing component signal.

BRIEF DESCRIPTION OF THE DRAWINGS

The invention will be more clearly understood from the following detailed description of an illustrative embodiment thereof when that description is read in conjunction with the accompanying drawings wherein:

FIGS. 2A through 2G and 3A through 3G show curves illustrating a variety of waveforms which occur during the processing of signals in the timing recovery circuit of FIG. 1;

FIGS. 4A through 4G show a series of waveforms occurring when the lock condition is achieved; and FIG. 5 is a functional block diagram of an alternative embodiment of a timing recovery circuit.

DETAILED DESCRIPTION

Figure 1:
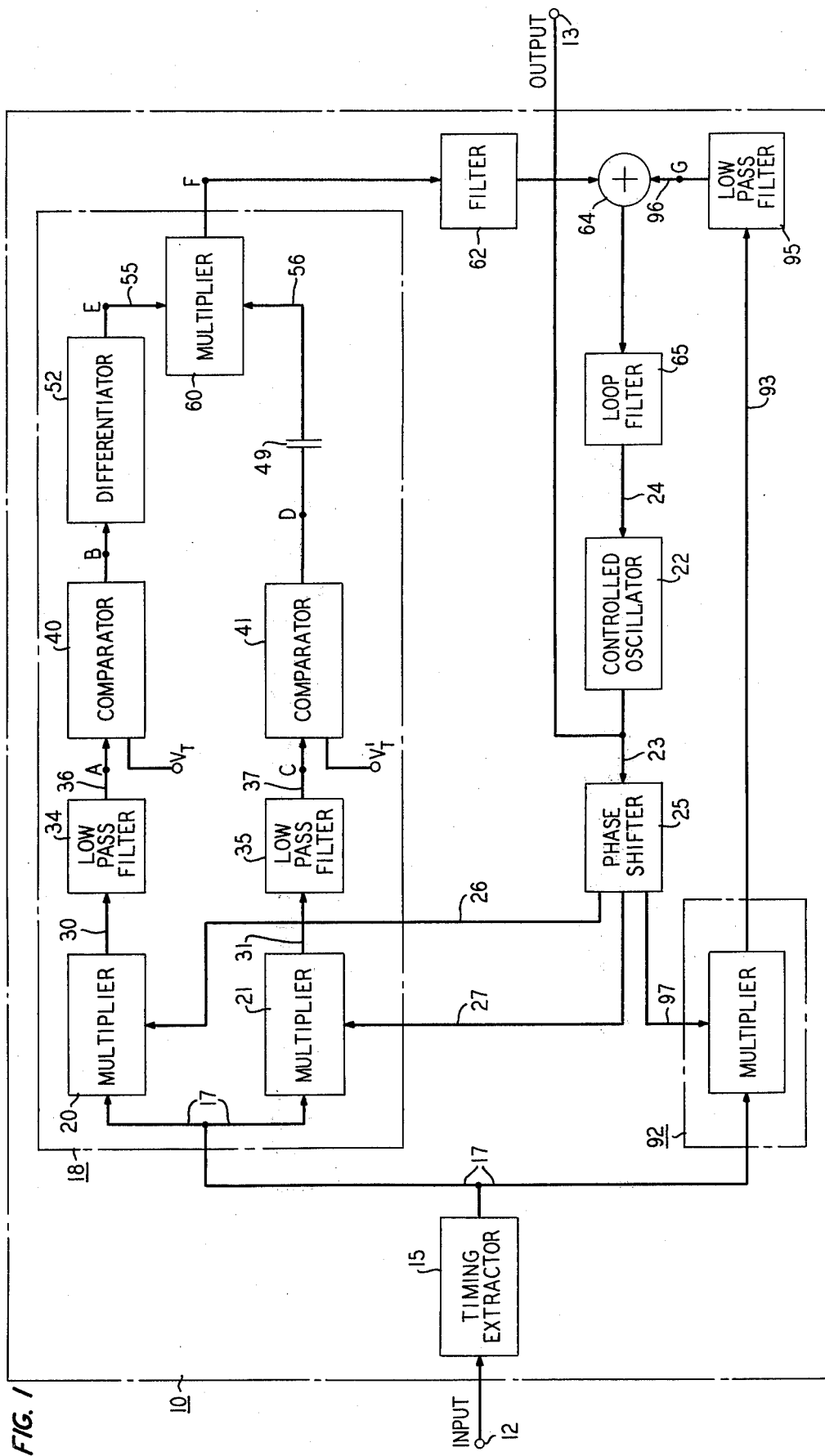
FIG. 1 is a functional block diagram of a timing recovery circuit including a phase-locked loop and a frequency-locked loop.

Referring to FIG. 1, a timing recovery circuit 10 receives, at an input 12, a stream of baseband digital data signals and produces, at an output 13, a periodic timing signal synchronized to the received baseband digital data stream.

The baseband data signals contain some information which characterizes the bit rate and the phase of the data stream. The characteristics of the bit rate and the phase together with their statistical variations are described by W. R. Bennett in *The Bell System Technical Journal*, Vol. 37, No. 6, November 1958 (pp. 1501–1542). For systems in which the bit rate equals the symbol rate, the timing information derived from the data stream is related to the bit rate. For systems wherein the bit rate is different from the symbol rate, the timing information is related to the symbol rate. Hereinafter the terminology bit rate is used throughout the specification, but the descriptions are intended to include the symbol rate in cases where the bit rate is different from the symbol rate.

A timing extractor 15, which may be similar to the circuits driving the tuned circuit of FIG. 7 of the Bennett article, extracts timing information from the input data stream. The extracted timing pulse stream contains both frequency and phase information of the input data stream. A principal timing component signal of the extracted timing pulse stream will be in the form $A(t)\sin \omega t + \phi(t)$ on leads 17. $A(t)$ is a time variable amplitude, and $\phi(t)$ is a time variable phase of the timing component signal. Angular velocity $\omega$ is $2\pi f_d$, where $f_d$ is the bit rate of the received digital data stream. The timing recovery circuit 10 synchronizes to the aforementioned form of the timing component signal as well as to other forms of timing signals.

The timing recovery circuit 10 includes a frequency difference detector arrangement 18 for producing error signals to reduce any difference between the bit rate of the received digital data stream and the frequency of a controlled oscillator except when the amplitude of the timing component signal falls below a predetermined value. In the frequency detector arrangement 18 there are first and second branches. Each branch includes one of a pair of multipliers 20 and 21 which are arranged to multiply the extracted timing pulse stream on leads 17 with periodic signals produced by a controlled oscillator 22. The multipliers 20 and 21 are selected to operate effectively at the anticipated bit rate of the extracted timing pulse stream.

The controlled oscillator 22 is an adjustable frequency source that changes frequency of its output signals on lead 23 in response to control signals applied by way of a lead 24 to its input. Because of the characteristics of the timing recovery circuit, there is no need for the controlled oscillator 22 to be an expensive close, or high, tolerance device. To the contrary, the rest frequency, which occurs when the control signal on lead 24 is nil, may be any of a relatively wide range of frequencies centered near the expected data bit rate.

A phase shifter 25 receives the output signals from the controlled oscillator 22 and produces, on leads 26 and 27, output signals having the same frequency as the controlled oscillator but having phases which differ from each other. No particular phase difference is essential, although a phase difference near 90° may be obtained readily in practice.

By multiplying the two different phase components of the periodic signals from the controlled oscillator 22 with the extracted timing pulses on leads 17, periodic waves including both sum and difference frequency component signals are produced on leads 30 and 31 in the two branches. The difference, or beat, frequency components, determined by the multipliers 20 and 21, represent the relative slip between the bit rate of the data stream and the frequency of signals produced by the controlled oscillator. This beat, or slip, frequency has a rate of one cycle for each cycle of slip between the bit rate and the frequency of the controlled oscillator. Hereinafter sense of the cycle slips refers to a determination of whether the bit rate of the data stream exceeds the frequency of the controlled oscillator, or vice versa.

The sum frequency components are filtered out by low pass series filters 34 and 35 which attenuate signals at frequencies higher than the anticipated difference, or slip, frequency. Thus the slip frequency components pass through the filters 34 and 35 and are applied by way of leads 36 and 37, respectively, to series comparators 40 and 41. For convenience in the subsequent discussion, the waveform on lead 36 is considered to be in-phase and the waveform on lead 37 is considered to be out-of-phase.

FIGS. 2, 3 and 4 include a series of waveforms distinguished by capital letter designators A through G. Each waveform so designated relates to a FIG. 1 circuit node having the same capital letter designator.

The slip frequency components on nodes A and C of leads 36 and 37 are related waveforms having zero crossings which alternate with each other but are not necessarily sinusoidal. As shown by waveforms 44 and 45 in FIGS. 2A and 2C, leading wavefrom 44 has a negative-going zero crossing which occurs before a negative-going zero crossing in lagging waveform 45. Thereafter waveform 44 has a positive-going zero crossing followed by a similar positive-going zero crossing by waveform 45. Since the phase of waveform 44 leads the phase of the waveform 45° by 90° in FIG. 2, the peaks of waveform 44 coincide with the zero crossings of waveform 45 and vice versa. Such peak-to-zero crossing coincidence is not required by the invention and does not occur when the phase relationship between waveforms 44 and 45 is other than the 90° shown in FIG. 2.

Although they are shown having similar amplitudes in FIG. 2, the amplitudes of the two slip frequency components at nodes A and C may differ from each other.

Each of the comparators 40 and 41 in FIG. 1 operates on its slip frequency input signal and quantizes those signals. Each comparator produces, at the slip rate, one output level when the input signal exceeds a predetermined threshold value and another output level when the input signal is less than the threshold value. As shown in FIG. 1, the thresholds are established at $V_T$ and $V_T'$ volts, which can have a value of zero volt. If the amplitude of the timing component signal is low enough, when processed through the multipliers 20 and 21 and the filters 34 and 35, that the resulting signals are less than the thresholds $V_T$ and $V_T'$, respectively, there are no output level shifts from the comparators 40 and 41.

In FIGS. 2B and 2D, the waveforms 46 and 47, respectively, show the bilevel output signals from the comparators 40 and 41 in response to the waveforms 44 and 45 of FIGS. 2A and 2C. Although the signals on leads 36 and 37 vary in amplitude with input data statistics and with the slip rate, the output signal levels of the comparators have fixed values at nodes B and D.

In FIG. 1 a capacitor 49, which is in series with the output of comparator 41 in the lower branch, blocks any direct current that occurs in waveform 47 of FIG. 2D and thereby assures that the high and low levels are at positive and negative polarities with respect to ground, as shown in FIG. 2D. Although the capacitor 49 is shown in the illustrative embodiment, it is optional rather than essential to the operation of the invention.

A non-ideal differentiator 52 which is connected in series with the output of the comparator 40 in the upper branch of FIG. 1, produces an output pulse, as shown by waveform 53 in FIG. 2E, for every transition in the output waveform of the comparator 40, as shown by waveform 46 in FIG. 2B. The output pulse rate is directly related to the rate of cycle slips between the timing signal component on leads 17 and the frequency of the shifted controlled oscillator signal on lead 26 except when the amplitude of the timing component falls below a value required to produce a beat signal large enough to change the output level of the comparator 40. Then no pulses are produced because there are no level shifts produced by the comparator 40. The polarity of each output pulse in waveform 53 of FIG. 2E agrees with the sign of the slope of the corresponding transition in the waveform 46 of FIG. 2B.

In FIG. 1, the output of the differentiator 52 via lead 55 and the output of comparator 41 via the capacitor 49 and a lead 56 are connected to two different inputs of a multiplier 60. Thus the waveforms 47 and 53 of FIGS. 2D and 2E, respectively, representing the out-of-phase slip frequency signal and the differentiated pulses at the slip rate, are multiplied together. The multiplier 60 generates at node F a series of consistent polarity pulses, as shown by waveform 61 in FIG. 2F. The pulses in waveform 61 occur at a rate directly related to the rate of cycle slips between the timing component signal on leads 17 and the frequency of the controlled oscillator signal on lead 26 except when the amplitude of the timing component signal falls below the predetermined value.

The polarity of the output control signals depends upon the sense of the cycle slips, i.e., the frequency of the controlled oscillator relative to the bit rate of the received data stream. If the bit rate of the received data stream is below the frequency of the controlled oscillator, it is assumed that the waveforms at points A and B in FIG. 1 lead the waveforms at points C and D in FIG. 1, as shown in FIGS. 2A, 2B, 2C and 2D. Resulting control pulses of FIG. 2F have a negative polarity.

In addition to the consistent polarity of the output control signals of waveform 61, the pulses therein have a uniform amplitude because the waveform 47 and the waveform 53 both have stable pulse amplitudes. Also the number of control pulses per second in the waveform 61 is determined directly from the slip rate between the bit rate of the data stream applied to the terminal 12 in FIG. 1 and the frequency of the output of the controlled oscillator 22 except when the amplitude of the timing component falls below the predetermined value. Then the repetition rate goes to zero.

In addition to the just described frequency detector 18, the frequency-locked loop includes a third branch. In the third branch, the output of the multiplier 60 at node F is applied through a series circuit including a filter 62, a summing circuit 64, a loop filter 65, and the lead 24 to the controlled oscillator 22. The polarity of the control pulses at node F is such that when the pulses are processed through the filter, the summing circuit and the loop filter, the resulting signal causes the slip rate, or the difference between the bit rate of the data stream and the frequency of the oscillator, to decrease. Because the repetition rate of the pulse stream at node F is directly related to the rate of cycle slips during acquisition, the amplitude of the filtered waveform of the control pulses causes more correction for a higher slip rate and less correction for a lower slip rate.

FIGS. 3A through 3F show a different series of waveforms taken from the same circuit nodes as the series of waveforms of FIGS. 2A through 2F. The phases of waveforms 74 and 76, however, lag the phases of waveforms 75 and 77 indicating that the frequency of the controlled oscillator is less than the bit rate of the received data stream. Thus the sense of the slip of frequency is opposite the sense for the example shown in FIG. 2. The polarities of the resulting waveforms 77 and 83 in FIGS. 3D and 3E are such that when applied to the two inputs of the multiplier 60, they generate at node F a waveform 91 having control pulses of a positive polarity. The waveform 91, like the waveform 61, is a pulse stream including pulses having a uniform amplitude and a repetition rate which is determined directly by the slip rate except when the amplitude of the timing component is less than the predetermined value. Then the repetition rate is zero. Because the sense of the slip is opposite to the slip of FIG. 2, the pulse stream includes only positive polarity pulses rather than negative polarity pulses, as shown in waveform 61 of FIG. 2F.

The pulse stream of waveform 91 in FIG. 3F, when processed through filter 62, summing circuit 64, loop filter 65 and applied to the controlled oscillator 22, results in a signal which will cause a decrease in the difference between the bit rate and the frequency of the controlled oscillator 22.

Thus the control pulses at node F, whether of positive or of negative polarity, when processed through the filters 62 and 65 and applied to the controlled oscillator 22 will cause the difference frequency to decrease.

Phase lock can be assured by selecting a pulse size in waveforms 61 and 91 so that frequency steps made by oscillator 22 in response to the pulses are smaller than the pull-in range of the phase-locked loop to be described.

Referring once again to FIG. 1, the phase-locked loop is a series circuit which includes a multiplier, or phase detector, 92. The output of the multiplier 92 is connected by way of lead 93, a low-pass filter 95, and a lead 96 to a second input of the summing circuit 64. It is further connected through the loop filter 65, the controlled oscillator 22, the phase shifter 25, and a lead 97 to a second input of the multiplier 92. In the summing circuit 64, a control component, produced by the multiplier 92 and the filter 95 and including phase error signals, is combined with the series of pulses from the multiplier 60.

Referring now to FIG. 4, there is shown a series of waveforms which occur at the circuit nodes A through G of FIG. 1. The waveforms of FIG. 4 illustrate the signals produced at the various nodes when slip has ceased and phase lock is achieved in an example wherein the phase of signals on leads 27 and 97 are equal and $V_T$ and $V_T'$ have small negative values.

Phase locking is achieved through the phase-locked loop when the slip between the bit rate of the data stream and the frequency of the controlled oscillator falls within the pull-in range of the phase-locked loop. As the phase of he oscillator 22 aligns with the phase of the data stream, slip ceases allowing the control component from the low-pass filter 95 to be a slowly varying phase error voltage at node G. The magnitude of the phase error voltage at node G decreases until it reaches a small noise signal near zero when the phases are fully aligned, as shown in FIG. 4G. When the phases are fully aligned, the phase of signals on lead 97 and the phase of the timing component signals on leads 17 are close to quadrature, as in conventional phase-locked loops.

Within the pull-in range of the phase-locked loop, the polarity of the phase error voltage at node G, when processed through the summing circuit 64 and the loop filter 65 and applied to the controlled oscillator 22, is such that the phase error signal causes the difference in phases between the received bit stream and the output of the controlled oscillator to stabilize with a predetermined relationship.

After phase lock is achieved, the output of the multiplier 60 is nil as long as the difference frequency signal 100 of FIG. 4A does not cross threshold $V_T$. As shown in FIG. 4A, a wide range of input variation can occur without signal 100 crossing the threshold $V_T$. As a result of the nil output, the frequency controlled loop ceases to affect performance of the timing recovery circuit after phase lock has been achieved.

Filter 62 is characterized by low gain at low frequencies and high gain at high frequencies to insure frequency acquisition for any set of initial conditions. Pulses generated during acquisition pass through the filter 62 unattenuated. After lock has been achieved, the output of multiplier 60 should be nil but may be slightly off zero. Such off zero residual offset from the multiplier 60 is attenuated by the filter 62.

Loop filter 65 is characterized by several features. The frequency characteristics are determined by considering them together with the phase integrating property of the controlled oscillator 22 and gain characteristics of other components in the phase-locked loop. Very large low frequency loop gain is provided for achieving small phase error once phase lock is achieved. The phase-locked loop design is not restricted by considerations of pull-in range and speed nor by very high direct current gain. These restrictions which apply to the prior art do not restrict the design of the illustrative circuit because the frequency-locked loop assures rapid wide range pull-in and overcomes gain saturation in the oscillator. Otherwise the loop filter 65 is designed in accordance with the design procedures used for the design of conventional phase-locked loops. Narrow jitter bandwidth, well controlled jitter transient response, and stable phase offset usually are the objectives.

The frequency-locked loop assures rapid wide range pull-in regardless of the bandwidth of the phase-locked loop because the frequency-locked loop generates the stream of control pulses in response to cycle slips whenever the phases are not locked including during saturation of the oscillator control circuit. In response to the signal derived from the stream of control pulses, the frequency of the oscillator is swept to the bit rate of the input digital data stream.

Thus the phase-locked loop yields a desirable transient characteristic for the input 12 to output 13 phase error transfer function. For example, phase jitter amplification in the pass band of the phase-locked loop can be minimized by selecting the open loop transfer function of the phase-locked loop to have approximately 6 decibels per octave gain slope in a wide band surrounding the unity gain crossover. Outside of that band the transfer function can have a steeper slope.

Although comparators 40 and 41 are shown in FIG. 1, a more general arrangement of the timing recovery circuit includes a pair of Schmitt triggers in place of the comparators. Such Schmitt triggers have a dead zone in their characteristics near the references $V_T$ and $V_T'$. As a result of such dead zone, the Schmitt triggers avoid responding to minor signal fluctuations in the dead zone and assure that the signals on nodes A and C are actually crossing the reference before changing output levels at nodes B and D.

It is noted that the signals on nodes A and C can be used as auxiliary outputs. At node A, the signal is the amplitude modulation, or the transition density of the input bit stream. At node C, the signal is the input signal to output signal phase error.

Referring now to FIG. 5, there is shown an alternative embodiment. The circuit of FIG. 5 is substantially like the cirucit of FIG. 1, and therefore elements in FIG. 5 which are the same as elements of FIG. 1 are identified by the same designator used in FIG. 1.

The differences between FIG. 5 and FIG. 1 relate to the arrangement of the phase-locked loop. In FIG. 5, the operations performed by the phase detector 92 and the filter 95 of FIG. 1 are performed in FIG. 5 by the multiplier 21 and the low-pass filter 35. The phase-locked loop is completed by connecting a lead 103 between the node C and the second input of the summing circuit 64. As a result, the phase detector 92 and the filter 95 are not required in the circuit of FIG. 5.

The foregoing describes an illustrative embodiment of the invention. In view of that description, additional embodiments thereof will be obvious to those skilled in the art. The above-described embodiment together with those additional embodiments are considered to be within the scope of the invention.

What is claimed is:

1. A timing recovery circuit comprising
means for receiving a timing component,
means for generating a signal having a frequency varying in response to a control signal,
means responsive to a difference between phase of the variable frequency signal and phase of the timing component for producing a control component,
means responsive to cycle slips between the variable frequency signal and the timing component for producing a series of pulses having a polarity related to the sense of the cycle slips and having a repetition rate directly related to the rate of the cycle slips except when amplitude of the timing component falls below a predetermined value whereupon no pulses are produced, and
means for combining the control component with the series of pulses into the control signal that adjusts the frequency of the signal from the generating means into synchronization with the timing component.

2. A timing recovery circuit in accordance with claim 1 wherein the means for producing the control component includes means for providing the control component with a polarity for reducing the difference between phase of the variable frequency signal and phase of the timing component.

3. A timing recovery circuit in accordance with claim 1 wherein the means for producing the control component includes means for providing the contol component with a polarity for stabilizing the difference between phase of the variable frequency signal and phase of the timing component.

4. A timing recovery circuit in accordance with claim 1 wherein the means for producing the series of pulses includes means for providing a uniform pulse polarity for reducing cycle slips.

5. A timing recovery circuit in accordance with claim 4 wherein the means for producing the control component includes means for providing the control component with a polarity for reducing the difference between phase of the variable frequency signal and phase of the timing component.

6. A timing recovery circuit in accordance with claim 4 wherein the means for producing the control component includes means for providing the control component with a polarity for stabilizing the difference between phase of the variable frequency signal and phase of the timing component.

7. A frequency-locked loop and phase-locked loop comprising,
means for extracting timing information from a stream of baseband data signals,
means for producing an adjustable frequency signal,
means for determining and quantizing first and second beat frequency signals from the data signals and the adjustable frequency signals, the second beat frequency signal being out-of-phase with the first beat frequency signal,
means for differentiating the first beat frequency signal into a differentiated signal,
means for generating control pulses of uniform amplitude from the differentiated signal and the second beat frequency signal, and
means for applying a control signal including a combination of the control pulses and the second beat frequency signal to the adjustable frequency producing means for reducing the frequency of the beat frequency signals and locking the loop in phase with the bits of the baseband data signals.

8. A frequency-locked loop and phase-locked loop in accordance with claim 7 wherein the generating means comprise a multiplier responsive to the differentiated signal and the second beat frequency signal for producing the control pulses.

9. A frequency-locked loop and phase-locked loop in accordance with claim 7 wherein the applying means include a loop filter responsive to the control pulses and to the second beat frequency signal for producing the control signal.

10. A frequency-locked loop and phase-locked loop in accordance with claim 9 wherein the loop filter has a first gain slope for a predetermined band of frequencies and a second gain slope for frequencies outside of the predetermined band.

11. A frequency-locked loop and phase-locked loop in accordance with claim 7 wherein the generating means comprise means responsive to the differentiated signal and the second beat frequency signal for producing the control pulses having a polarity for adjusting the frequency of the producing means to the bit rate of the baseband data signals.

12. A frequency-locked loop and phase-locked loop in accordance with claim 11 wherein the responsive means produces pulses at a rate directly related to the difference between the bit rate and the frequency of the adjustable frequency signal.

13. A frequency-locked loop and a phase-locked loop in accordance with claim 11 wherein a lead feeds back the second beat frequency signal to the producing means for decreasing phase difference between the adjustable frequency signal and bits of the baseband data signals.

14. A frequency-locked loop and a phase-locked loop in accordance with claim 11 wherein a lead feeds back the second beat frequency signal to the producing means for stabilizing phase difference between the adjustable frequency signal and bits of the baseband data signals.

15. In combination
a frequency-locked loop comprising
  means for receiving extracted timing signals;
  a first branch including in series circuit arrangement
    a first multiplier responsive to the extracted timing signals,
    a first low pass filter,
    a first comparator,
    a differentiator;
  a second branch including in series circuit arrangement
    a second multiplier responsive to the extracted timing signals,
    a second low pass filter, and
    a second comparator;
  a third multiplier responsive to the output of the differentiator and the output of the second comparator for producing cycle slip pulses;
  a third branch including in a series circuit arrangement
    a summing circuit responsive to the output of the third multiplier,
    a loop filter,
    a controlled oscillator, and
    a phase shifter having first and second phase outputs,
  means connecting the first phase output of the phase shifter to a second input of the first multiplier and the second phase output of the phase shifter to a second input of the second multiplier; and a phase-locked loop comprising
  the second multiplier and the second low pass filter,
  means for connecting the output of the second low pass filter to a second input of the summing circuit.

16. In combination
a frequency-locked loop comprising
  means for receiving extracted timing signals;
  a first branch including in series circuit arrangement
    a first multiplier responsive to the extracted timing signals,
    a first low pass filter,
    a first comparator,
    a differentiator;
  a second branch including in series circuit arrangement
    a second multiplier responsive to the extracted timing signals,
    a second low pass filter, and
    a second comparator;
  a third multiplier responsive to the output of the differentiator and the output of the second comparator for producing cycle slip pulses;
  a third branch including in a series circuit arrangement
    a summing circuit responsive to the output of the third multiplier,
    a loop filter,
    a controlled oscillator, and
    a phase shifter having first and
  second phase outputs,
  means connecting the first phase output of the phase shifter to a second input of the first multiplier and the second phase output of the phase shifter to a second input of the second multiplier; and a phase-locked loop comprising
  a phase detector,
  a third low pass filter,
  means connecting the output of the third low pass filter to a second input of the summing circuit,
  means connecting an output of the phase shifter to a second input of the phase detector.

* * * * *